United States Patent [19]

Schwartzbauer

[11] Patent Number: 5,169,804
[45] Date of Patent: Dec. 8, 1992

[54] METHOD FOR FASTENING A SEMICONDUCTOR, BODY PROVIDED WITH AT LEAST ONE SEMICONDUCTOR COMPONENT TO A SUBSTRATE

[75] Inventor: Herbert Schwartzbauer, Munich, Fed. Rep. of Germany

[73] Assignee: Siemens Aktiengesellschaft, Munich, Fed. Rep. of Germany

[21] Appl. No.: 756,042

[22] Filed: Sep. 6, 1991

[30] Foreign Application Priority Data

Sep. 6, 1990 [DE] Fed. Rep. of Germany ....... 4030446

[51] Int. Cl.⁵ .......................................... H01L 21/60
[52] U.S. Cl. .................................. 437/209; 437/211; 437/212; 437/221; 228/123; 257/678
[58] Field of Search ............... 437/209, 211, 215, 221, 437/222, 212; 357/74; 228/123, 124

[56] References Cited

U.S. PATENT DOCUMENTS

| | | | |
|---|---|---|---|
| 4,742,024 | 5/1988 | Sugimoto et al. | 437/211 |
| 4,810,672 | 3/1989 | Schwarzbauer | 437/209 |
| 4,814,295 | 3/1989 | Mehtu | 437/209 |
| 4,818,728 | 4/1989 | Rai et al. | 437/209 |
| 4,849,374 | 7/1989 | Chen et al. | 437/209 |
| 4,903,885 | 2/1990 | Schwarzbauer | 228/106 |
| 4,999,077 | 3/1991 | Drake et al. | 437/209 |

FOREIGN PATENT DOCUMENTS

| | | | |
|---|---|---|---|
| 63-173334 | 7/1989 | Japan | 437/209 |
| 1-289259 | 11/1989 | Japan | 437/209 |

Primary Examiner—Brian E. Hearn
Assistant Examiner—Kevin M. Picardat
Attorney, Agent, or Firm—Hill, Van Santen, Steadman & Simpson

[57] ABSTRACT

In a method for fastening a semiconductor body provided with at least one component to a substrate, an under side of the semiconductor body is provided with a first contacting layer and with a powdered metal layer covering this first contacting layer. An upper side of the substrate is provided with a second contacting layer. The coated surfaces of the semiconductor body and of the substrate are then pressed together while being heated. When the semiconductor body is composed of a part of a semiconductor wafer that comprises a plurality of identical or similar parts, then the first contacting layer and the powdered metal layer of the invention are applied in common on the back side of the semiconductor wafer for all semiconductor bodies. The powdered metal layer is sintered, the semiconductor wafer is glued onto an adhesive film, the semiconductor wafer is subsequently pre-sawed or sawed through along parting lines that surround the semiconductor bodies, and the isolated semiconductor bodies are pulled off from the adhesive film and fastened on the substrate.

14 Claims, 2 Drawing Sheets

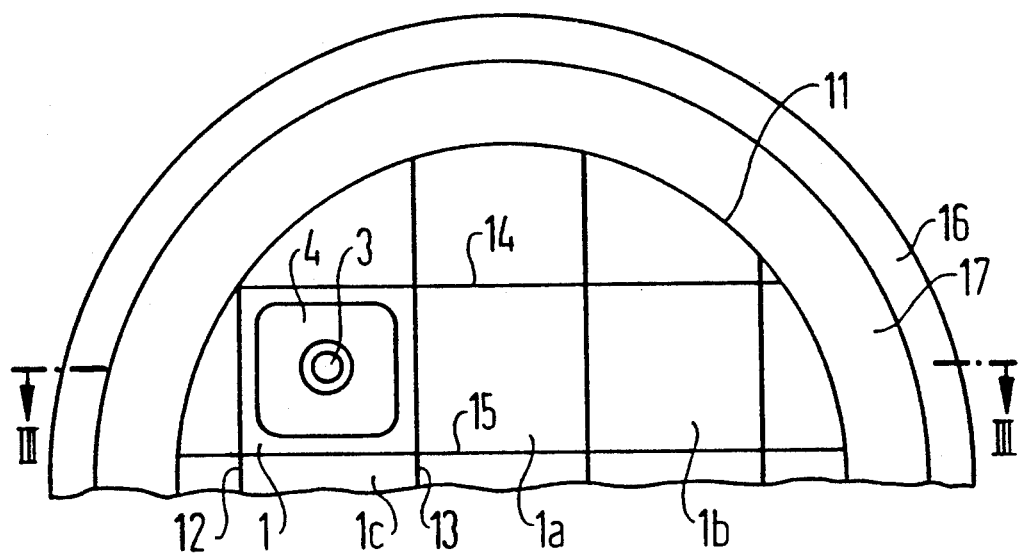
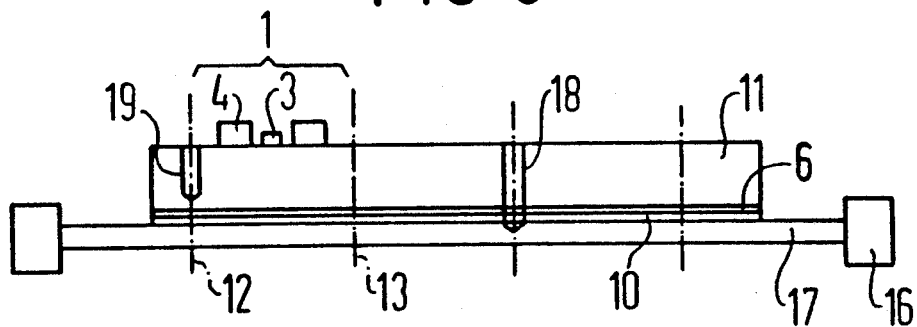

METHOD FOR FASTENING A SEMICONDUCTOR, BODY PROVIDED WITH AT LEAST ONE SEMICONDUCTOR COMPONENT TO A SUBSTRATE

BACKGROUND OF THE INVENTION

The invention is directed to a method for fastening a semiconductor body provided with at least one semiconductor component to a substrate wherein the semiconductor body is provided with a first contacting layer on one boundary surface and a boundary surface of the substrate is provided with a second contacting layer. A powered metal layer is applied on the first contacting layer. Thereafter, the semiconductor body and the substrate have their boundary surfaces carrying the contacting layers pressed together upon application of heat.

Methods of this type are disclosed by European Patent Applications EP-A-0 242 626 and EP-A-0 330 894, corresponding respectively to U.S. Pat. Nos. 4,810,672 and 4,903,885, both incorporated herein. The substrate thus serves the purpose of holding the semiconductor body and of also eliminating the heat arising in the semiconductor component, this being significant, particularly given power semiconductor components.

SUMMARY OF THE INVENTION

An object of the invention is to specify a method of the type initially cited wherein the semiconductor body is composed of a part of a semiconductor wafer that comprises a plurality of such semiconductor bodies, without requiring a time-consuming and unsurveyable manipulation with the individual semiconductor bodies to be separated from this wafer.

According to the invention, the semiconductor body is composed of a portion of a semiconductor wafer that has a plurality of identical or similar parts. The first contacting layer and the powered metal layer are applied in common on the back side of the semiconductor wafer for all semiconductor bodies. The powered metal layer is heated to a sintering temperature for a given time span. The semiconductor wafer subsequently has its back side glued onto an adhesive film. The semiconductor wafer is then pre-sawed or sawed along parting lines that surround the semiconductor bodies. The semiconductor body is pulled off from the adhesive film after being completely separated from the remaining semiconductor wafer and is secured on the substrate by pressing together with the application of heat. The powered metal layer is sintered to the first contacting layer to such an extent based on an appropriate choice of time span and of the sintering temperature such that the semiconductor body coated with the powered metal layer can be pulled off undamaged from the adhesive film prior to securing to the semiconductor wafer.

One advantage obtainable with the invention is that all semiconductor bodies situated on a semiconductor wafer are first provided in common with the first contacting layer and with the powdered metal layer. The powdered metal layer is then sintered. This sintering is what enables the coated semiconductor back side to be glued onto an adhesive film for the purpose of sawing the semiconductor wafer. Thus, after the complete or partial parting of the wafer, the isolated semiconductor bodies are held in their fixed, mutual allocation established by the adhesive film until they are pulled off from the adhesive film and provided for fastening on a substrate.

BRIEF DESCRIPTION OF THE DRAWINGS

FIGS. 2 and 3 are schematic illustrations for explaining the method of the invention.

DESCRIPTION OF THE PREFERRED EMBODIMENTS

Figure 1:
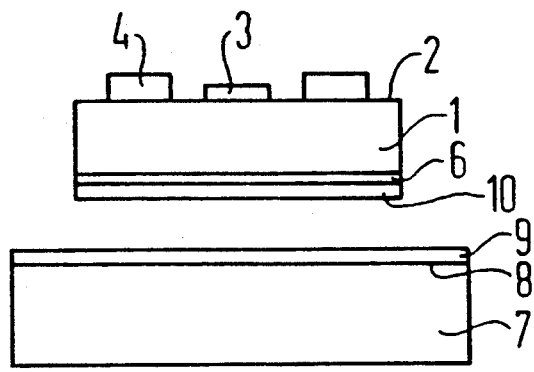
FIG. 1 is a schematic illustration for explaining a known method.
Figure 4:
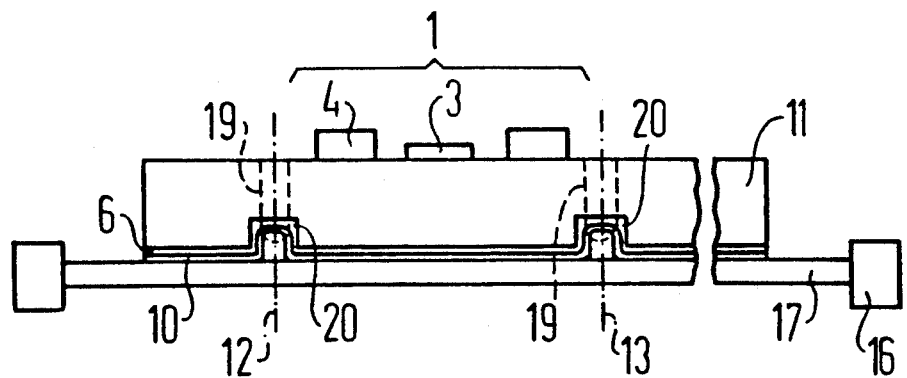
FIG. 4 is an illustration for explaining an advantageous development of the method of the invention.

FIG. 1 shows a section through a semiconductor body 1 composed of doped semiconductor material, for example Si. This, for example, is a thyristor that has its upper boundary surface 2 provided with aluminum structures, namely with a gate contact 3 and with an annular cathode electrode 4. Two p-conductive layers that respectively represent the p-base and the p-emitter are thus inserted into the n-conductive semiconductor body i. An n-conductive layer that forms the n-emitter and which is contacted by the cathode electrode 4, is also inserted into the p-base. For reasons of simple illustration, these layers introduced into the semiconductor body 1 are not shown in FIG. 1. The lower boundary surface of body 1 is covered with a contacting layer that is formed of a plurality of sub-layers.

In detail, these are composed of a 1 $\mu$m thick aluminum layer applied directly onto the lower boundary surface of body 1, of an approximately 100 nm thick titanium layer applied on this aluminum layer, of an approximately 500 nm thick nickel layer lying over this titanium layer, and of an approximately 200 nm thick silver layer that covers this nickel layer. 7 references a substrate that is composed of molybdenum. The upper limiting surface 8 of the substrate 7 is provided with a contacting layer 9 that is approximately 2 to 3 $\mu$m thick, and is composed of silver.

For fastening the semiconductor body 1 to the substrate 7, one proceeds according to one of the known methods such that a powdered metal layer 10 is applied on the contacting layer 6. Silver powder having lamina-shaped powder particles with a grain size below or equal to 15 $\mu$m is employed as an initial material. This silver powder is suspended in cyclohexanol as a solvent in a weight ratio of approximately 2:1. After being applied on the contacting layer 6, the paste is dried by expelling the solvent. Subsequently, the semiconductor body 1 and the substrate 7 have their boundary surfaces carrying the contacting layers 6 and 9 pressed together while heat is being applied. Thus, they are brought to a sintering temperature of, for example, 230° C. and are pressed against one another with a pressure of at least 900 N/cm$^2$. The sintering time preferably amounts to one minute. The substrate 7 represents the anode electrode for the semiconductor body 1 of FIG. 1 secured on the substrate 7.

According to FIG. 2, the semiconductor body 1 is part of a semiconductor wafer 11 that comprises a plurality of such semiconductor bodies, for example 1, 1a, 1b, 1c, etc. These are demarcated from one another by parting lines, for example 12 through 15. After the semiconductor components indicated by the structures 3 and 4 have been produced, the semiconductor wafer 11 is glued onto an adhesive film 17 held in an annular frame 16. FIG. 3 thus shows a sectional view along the line III—III in FIG. 2. If the glued-on semiconductor wafer 11 were divided along the parting lines, for example 12 through 15, and if each individual semiconductor body, for example 1, that results were coated with the silver paste according to the known methods set forth with reference to FIG. 1, then this would require a time-consuming and unsurveyable manipulation with the individual semiconductor bodies.

One proceeds according to the invention such that the powdered metal layer 10 is applied in common for all semiconductor bodies on the back side of the semiconductor wafer 11 that comprises a plurality of semiconductor bodies 1, 1a, 1b, 1c, etc., provided with integrated semiconductor components. This coating occurs for the entire semiconductor wafer 11 according to the methods set forth for an individual semiconductor body with reference to FIG. 1. Subsequently, the powdered metal layer 10 is heated to a sintering temperature of, for example, 250° C. for a time span of, for example, one minute. The powdered metal layer thus already sinters so firmly to the contacting layer 6 that it can no longer be torn off by an adhesive film. The semiconductor wafer 11 is then glued onto the adhesive film 17 in a standard way with its sintered-on powdered metal layer 10 and is divided into the individual semiconductor bodies, for example 1 through 1c, with a wafer saw along the parting lines, for example 12 through 15, marked on the front side of the semiconductor. This is indicated in FIG. 3 by a saw slot 18 that extends into the adhesive film 17. However, it is also possible to merely pre-saw the semiconductor wafer 11 at the parting lines, this being indicated by a saw slot 19 that does not penetrate as deeply, and to break the parts of the semiconductor wafer 11 remaining under these saw slots by bending the semiconductor wafer 11. In any case, an individual semiconductor body 1 separated from the semiconductor wafer 11 can be subsequently pulled off from the adhesive film 17 and can be offered for fastening to a substrate 7 without the sintered-on powdered metal layer 10 being damaged upon pull-off.

In a further preferred development of the method of the invention, the back side of the semiconductor wafer 11 is provided with a network of etched-in trenches 20 along the parting lines, for example 12 and 13, before the application of the contacting layer 6. The width of the trenches 20 must be greater than the cutting width of the saw employed for producing the saw slots 18 or 19. The depth of the trenches 20 should advantageously correspond to half the cut width, but can also be matched to the cut width of the saw. This development reliably prevents a saw burr that could possibly arise when sawing the semiconductor wafer 11 from proceeding into the connecting plane when the semiconductor body is connected to the substrate 7. Such a saw burr is composed of adhering, small edge splinters of the individual semiconductor body 1, for example, and of deformed residues of the contacting layer 6 or of the powdered metal layer 10. Given a semiconductor wafer 11 provided with the trenches 20, the saw burr remains in the region of these trenches, so that it cannot disadvantageously influence the further connecting process between semiconductor body and substrate.

By way of addition to the above-recited parameters when sintering the powdered metal layer 10, let it be pointed out that sintering temperatures from 150° C. through approximately 300° C. can also be applied for a time span from, for example 20 minutes, down to approximately 0.1 minutes.

The invention has substantial significance both for power semiconductors such as, for example thyristors and transistors, as well as for semiconductor components or monolithically integrated circuits that are utilized where an extremely good heat elimination is a prerequisite for the functionability.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for fastening a semiconductor body provided with at least one component to a substrate, comprising steps of:
   providing a semiconductor wafer that has a plurality of at least similar parts, each part of which comprises a semiconductor body to be fastened to a corresponding substrate;
   providing the semiconductor wafer for all semiconductor bodies with a first contacting layer and a powdered metal layer in common on a back side of the semiconductor wafer, and also providing a boundary surface of the substrate with a second contacting layer;
   heating the powdered metal layer to a sintering temperature for a given time span;
   gluing the sintered powdered metal layer on the back side of the semiconductor wafer onto an adhesive film;
   providing at least partially sawed slots along parting lines in the semiconductor wafer which surround the semiconductor bodies;
   pulling the semiconductor bodies from the adhesive film after they are completely separated from the remaining semiconductor wafer;
   securing the semiconductor bodies to the corresponding substrates by pressing the first and second contacting layers together with the powdered metal layer therebetween with application of heat; and
   said given time span and temperature for said sintering of said powdered metal layer applied on the first contacting layer being chosen such that when the semiconductor bodies are pulled off of the adhesive film, the semiconductor bodies and associated sintered powdered metal layer are substantially undamaged.

2. A method according to claim 1 wherein the sawed slots along the parting lines are completely sawed through the semiconductor wafer.

3. A method according to claim 1 wherein the sawed slots along the parting lines are partially sawed such that the slots do not penetrate completely through the semiconductor wafer.

4. A method according to claim 1 wherein the semiconductor bodies are identical to one another.

5. A method according to claim 1 wherein the semiconductor bodies are similar to one another.

6. A method according to claim 1 wherein the given time span for the sintering of the powdered metal layer is in a range from approximately 1 through 20 minutes.

7. A method according to claim 6 wherein the time span is approximately 1 minute.

8. A method according to claim 1 wherein the sintering temperature for the powdered metal layer when it is applied to the first contacting layer is in a range from approximately 150° C. through 300° C.

9. A method according to claim 8 wherein the sintering temperature is approximately 250°.

10. A method according to claim 1 including the step of providing the semiconductor wafer at its side where the first contacting layer and powdered metal layer are applied with trenches before the application of the first contacting layer, said trenches proceeding along said parting lines associated with the semiconductor bodies.

11. A method according to claim 10 wherein the trenches are etched into the semiconductor wafer.

12. A method according to claim 11 wherein a width of the trenches is greater than a cut width of a saw employed for providing slots to enable detaching the semiconductor bodies from one another, and the depth of the trenches corresponds to at least half the cut width.

13. A method according to claim 1 including the step of providing the partially sawed slots after the semiconductor wafer is glued on the adhesive film.

14. A method for fastening a semiconductor body provided with at least one component to a substrate, comprising steps of:
   providing a semiconductor wafer that has a plurality of at least similar parts, each part of which comprises a semiconductor body to be fastened to a corresponding substrate;
   providing the semiconductor wafer with a first contacting layer and a powdered metal layer on a back side of the semiconductor wafer, and also providing a boundary surface of the substrate with a second contacting layer;
   heating the powdered metal layer to a sintering temperature for a given time span;
   attaching the sintered powdered metal layer on the back side of the semiconductor wafer onto a working surface;
   providing parting sections in the semiconductor wafer which surround the semiconductor bodies;
   individually separating and removing the semiconductor bodies from the working surface;
   securing the semiconductor bodies to the corresponding substrates by pressing the first and second contacting layers together with the powdered metal layer therebetween; and
   said given time span and temperature for said sintering of said powdered metal layer applied on the first contacting layer being chosen such that when the semiconductor bodies are removed from the working surface, the sintered powdered metal layer is substantially not damaged by the removal.

* * * * *